(12) United States Patent
Worley

(10) Patent No.: US 6,445,601 B1
(45) Date of Patent: Sep. 3, 2002

(54) ELECTROSTATIC DISCHARGE PROTECTION CIRCUIT

(75) Inventor: Eugene Robert Worley, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/519,214

(22) Filed: Mar. 6, 2000

Related U.S. Application Data

(60) Provisional application No. 60/156,374, filed on Sep. 28, 1999.

(51) Int. Cl.$^7$ .............................................. H02H 7/122
(52) U.S. Cl. ....................................... 363/56; 307/354
(58) Field of Search ....................... 361/56, 101, 111; 257/355, 335, 358, 532, 534, 535, 297; 323/270; 307/362, 354

(56) References Cited

U.S. PATENT DOCUMENTS

| | | | | |
|---|---|---|---|---|
| 5,264,723 A | * | 11/1993 | Strauss | 257/532 |
| 5,287,241 A | * | 2/1994 | Puar | 361/56 |
| 5,751,525 A | * | 5/1998 | Olney | 361/56 |
| 6,002,567 A | * | 12/1999 | Zou et al. | 361/111 |

* cited by examiner

*Primary Examiner*—Rajnikant B. Patel
(74) *Attorney, Agent, or Firm*—Thomas, Kayden, Horstemeyer & Risley

(57) ABSTRACT

An electrostatic discharge protection circuit for protecting the output of a CMOS circuit includes the use of a saturation attenuation resistor in series with the output. The saturation attenuation resistor exhibits a low resistance value under low current conditions and a high resistance value under high current conditions. The saturation resistor in series with the output of a CMOS circuit thus has little effect on the current drive capability of that circuit during its normal operation. Upon the application of a high current ESD transient to the output, however, the saturation resistor assumes a high resistance value that acts to attenuate the voltage of the transient and protect the delicate gate dielectric of transistors at the output of the circuit.

14 Claims, 3 Drawing Sheets

ELECTROSTATIC DISCHARGE PROTECTION CIRCUIT

This Application claims priority from Provisional Application No. 60/156,374 filed Sep. 28, 1999.

FIELD OF THE INVENTION

This invention relates generally to an electrostatic discharge protection circuit, and more specifically to an electrostatic discharge protection circuit utilizing a saturation resistor.

BACKGROUND OF THE INVENTION

One problem facing the designers of metal oxide semiconductor (MOS) integrated circuits or complementary metal oxide semiconductor (CMOS) integrated circuits is the problem of protecting the gate insulator used in those circuits from electrostatic discharge (ESD). This problem becomes especially acute in CMOS circuits that use a very thin gate insulator. Currently circuits referred to as deep submicron CMOS integrated circuits are expected to have gate insulators as thin as 2 nanometers (nm). Breakdown voltages for such thin insulators, usually oxides, can be on the order of a few volts for ESD transients. ESD transients are typically low energy, high current pulses that can be modeled as a current source with a current having a magnitude on the order of amperes. The problem of protecting the thin insulator of the integrated circuit becomes one of shunting the ESD transient current so that a voltage less than the destructive breakdown voltage is applied across any gate insulator.

The input signals applied to an MOS circuit are applied to an input terminal. An input only terminal of an MOS circuit has MOS transistor gates electrically coupled to the terminal. An ESD transient appearing on the input terminal is thus applied directly across the gate insulator of the input MOS transistor or from the gate of the MOS transistor to the drain, source, and/or body of the transistor. Hence the need to protect the gate insulator of transistors exposed to an ESD transient appearing at an input terminal is widely recognized and, accordingly, a great deal of effort has been spent trying to protect the gate insulator of those input transistors from the damaging effects of ESD transients. One solution that has been applied for protecting the transistors at the circuit input is to use an attenuation network including four diodes and a series resistor. During an ESD transient, two diodes positioned at the input terminal are used as the primary transient current shunt path. The series resistor and the additional two diodes, connected across the input transistor gate, are used to provide a high impedance path for the transient such that the voltage of the transient appearing at the input terminal is attenuated before it reaches the gate of the input transistor.

The output from an MOS circuit is generally supplied by output driver transistors coupled to an output terminal. A high voltage ESD transient can also appear at the output terminal and can be applied to the gate of the driver transistors. The same attenuation networks used for ESD protection on circuit inputs, however, cannot be used for ESD transient protection of the output driver transistors. Because of the low impedance requirements of the MOS output driver transistors, the attenuation resistor would have to be of such low value that its effectiveness in attenuating an ESD transient appearing at the output terminal would be limited.

Although the output is generally taken at a drain or source of an output MOS driver transistor and not at a gate of that transistor, the ESD voltage on the output terminal appears between gate and drain or between gate and source of the output transistor. An ESD transient coupled to the output of a MOS circuit can thus be as destructive as would such a transient applied at the input of the circuit. Accordingly, a need exists for protecting the output of MOS circuits and that need is not met by the ESD protection circuits normally applied at the input of the circuit. Thus a need exists for an electrostatic discharge protection circuit for protecting the output of an MOS circuit.

BRIEF SUMMARY OF THE INVENTION

In accordance with one embodiment of the invention, an electrostatic discharge protection circuit for protecting the output of an MOS circuit includes a saturation resistor coupled between the output of the circuit and the output terminal. The saturation resistor is used, in accordance with an embodiment of the invention, with an impedance device that can be coupled between the output terminal and a reference potential. The saturation resistor has the property of having a low resistance at low current values and a high resistance at high current values. Thus the saturation resistor has little effect on the output during normal operation of the device, but provides a high resistance value in series with the output transistor when an electrostatic discharge transient is applied to the output terminal of the circuit.

BRIEF DESCRIPTION OF THE DRAWINGS

The invention will be better understood after the review of the following detailed description taken in connection with the drawings in which.

DETAILED DESCRIPTION OF PREFERRED EMBODIMENTS

Figure 1:
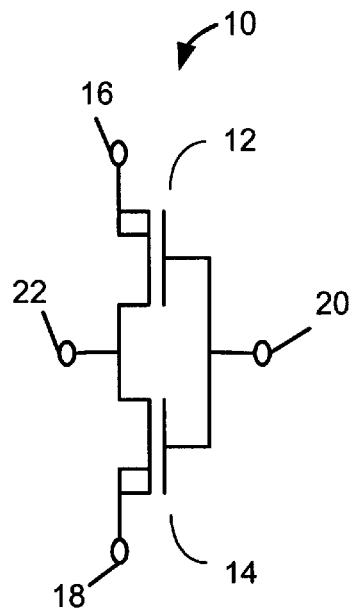
FIG. 1 illustrates a prior art CMOS integrated circuit.

FIG. 1 illustrates a typical CMOS inverter 10 that might be found on the output of a CMOS integrated circuit. In the discussion that follows, the circuit to be protected, in accordance with the invention, will be illustrated by such a CMOS inverter. The invention, however, is not to be limited to its application to such an inverter. Those of skill in the art will recognize that protection, in accordance with the invention, can be advantageously applied to the output of any MOS circuit. Although the term "CMOS" properly means complimentary metal oxide semiconductor, as used herein and as used commonly in the industry, CMOS will be used to refer to any insulated gate transistor structure regardless of the material used for the gate insulator and regardless of the material used for the gate electrode. Thus the term CMOS will refer to any complimentary insulated gate field effect transistor structure regardless of whether the gate insulator is oxide, nitride, or any other dielectric material and regardless of whether the gate electrode is metal, polycrystalline silicon, polycide, or the like.

CMOS inverter 10 includes a P channel transistor 12 coupled in series with an N channel transistor 14. The source and substrate of the P channel transistor are coupled to a referenced potential 16 which might be, for example, $V_{DD}$. The source and substrate of N channel transistor 14 are coupled to a second reference potential 18 which might be, for example, $V_{SS}$. Those familiar with CMOS circuit design will recognize that other reference potentials, either externally applied or internally generated, might be coupled to the CMOS inverter. An input 20 of the CMOS inverter is coupled to the gates of transistors 12 and 14. An output 22 of the inverter is taken at the junction between the drains of the two devices. If an electrostatic discharge (ESD) transient is applied to input 20 or to output 22, most of that transient appears across the gate insulator of both transistors 12 and 14. If the transient is applied to output 22, for example, the transient is applied between drain and gate of each device. If the circuit is not properly protected, a transient appearing on the output of inverter 10 can cause rupturing of the gate insulator of one or both of those transistors.

Figure 2:
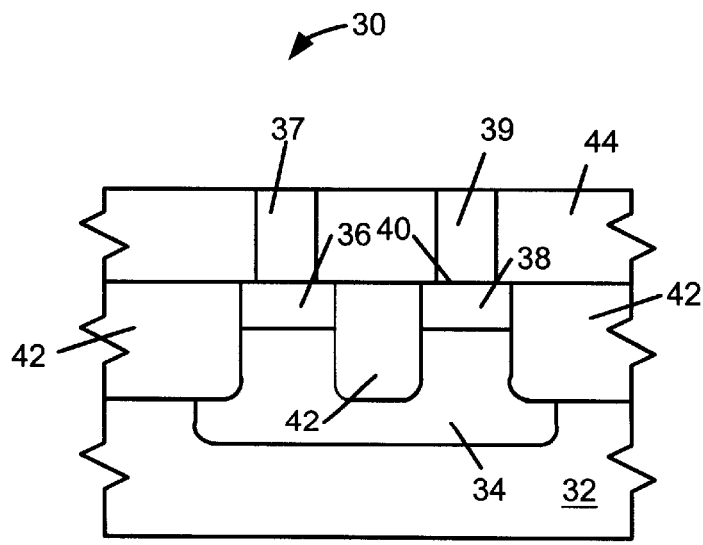
FIG. 2 schematically illustrates, in cross-section, the construction of a saturation resistor in accordance with an embodiment of the invention.

FIG. 2 illustrates, in cross-section, one embodiment of a saturation resistor 30 as such a saturation resistor finds application in an ESD protection circuit in accordance with the invention. In accordance with this embodiment of the invention, saturation resistor 30 is formed in a silicon substrate 32 which can be, for example, a P type silicon substrate. A doped region 34 forms the body of resistor 30. Doped region 34 is a lightly doped region of N type conductivity formed at the surface of substrate 32. Two spaced apart contact regions 36 and 38 are formed at a surface 40 of doped region 34. Regions 36 and 38 are high conductivity N type regions which facilitate the formation of low resistance contacts to the ends of doped region 34. Electrical contact to regions 36 and 38 can be made by metallic contacts 37 and 39, respectively. Metallic contacts 37 and 39 can be, for example, tungsten plugs or other commonly used contact technologies. The resistor is thus formed by the portion of doped region 34 located between the two contact regions. An isolation region 42 surrounds doped region 34 and also extends from surface 40 to a location within the body of resistor 30. Isolation region 42 can be a trench isolation or field oxide isolation. Formation of such an isolation region is well known in the art. An insulating layer 44, such as a layer of silicon dioxide, overlies the structure. Openings through insulating layer 44 are provided to allow metallic contacts 37 and 39 to contact regions 36 and 38. The various regions that make up resistor 30 can be formed during the normal processing of a CMOS circuit. For example, region 34 can be formed at the same time as the N type well in which P channel transistors of the CMOS circuit are formed. Region 34 can be formed, for example, by ion implantation, thermal diffusion, or the like. Contact regions 36 and 38 can be made by the same thermal diffusion or ion implantation doping step used to form the conventional source and drain regions of the N channel transistors of the CMOS circuit, and isolation 42 can be the same isolation that might be used to provide isolation between two adjacent devices.

Figure 3:
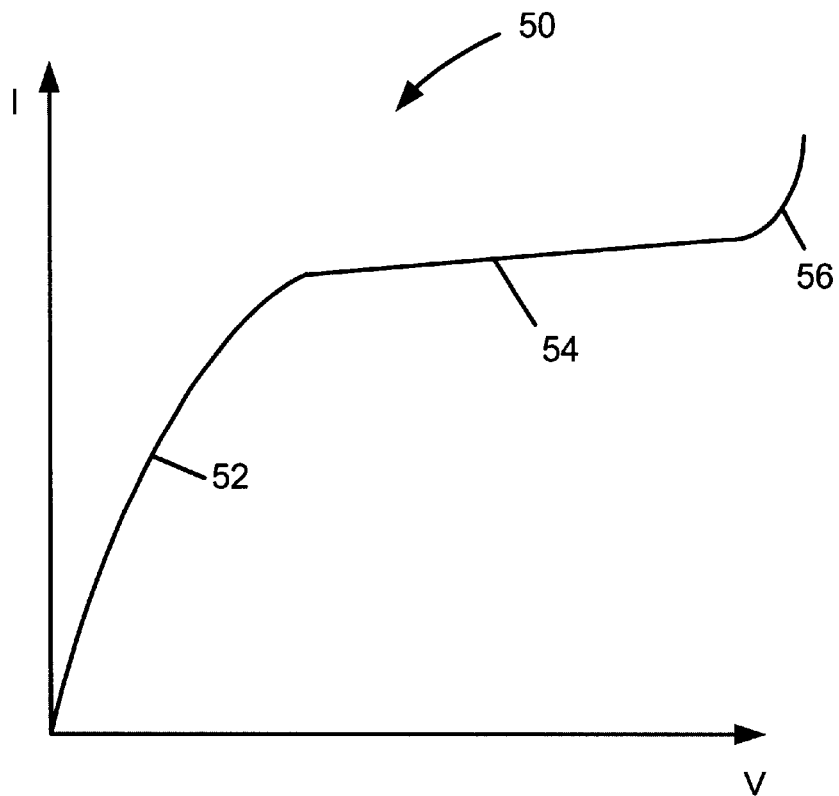
FIG. 3 illustrates graphically the current-voltage characteristics of a saturation resistor.

FIG. 3 illustrates in graphical form the current-voltage characteristics of a saturation resistor such as resistor 30. The saturation resistor presents a low impedance for very low currents (for example, currents of 20 milliamps or less) associated with the normal operation of the CMOS output circuit. At higher currents, however, the resistance increases dramatically so that at any currents above a few tens of milliamps, the resistor exhibits a very high resistance. For example, a saturation resistor formed as illustrated in FIG. 2 exhibits a low and substantially linear resistance in region 52 at low currents. Above a certain current value, the saturation current value, however, the resistor exhibits a high resistance region 54. At high voltages the resistor exhibits a break down region 56 because of avalanche break down of the PN junction between N type region 34 and P type substrate 32. For a typical CMOS process, the N type well region used to form a saturation resistor such as saturation resistor 30 illustrated in FIG. 2 can be doped to have a resistivity of about 1000 Ohms per square and a depth of about 1 micrometer ($\mu$m). The depth of isolation region 42 can be about ½ $\mu$m, or about ½ the depth of doped region 34. If doped region 34 has a width to length ratio (between contacts 36 and 38) of about 100 $\mu$m/1.2 $\mu$m, the resistor illustrated in FIG. 2 can have a linear region with the resistance of less than about 20 ohms and a saturation current of about 130 milliamps or less.

The resistor is preferably designed so that for a given resistance, the saturation current is small. The expression relating saturation current to the resistor parameters is given by $$I_{sat} = L v_{sat} / \mu R$$

where $I_{sat}$ is the velocity saturation current, L is the length of the resistor, $V_{sat}$ is the carrier saturated velocity, $\mu$ is the carrier mobility, and R is the resistance value of the resistor. From this it can be seen that making the resistor short (i.e., reducing L to a minimum) is desirable in that it lowers the saturation current for a given resistor value, R. The equation also indicates that lightly doped resistors help to minimize the saturation current for a given value of resistance because the carrier mobility increases as the doping level is decreased.

Although a preferred method for forming a saturation resistor, in accordance with an embodiment of the invention, is to form the resistor as an N well resistor as described above, other types of saturation resistors can also be used in the ESD protection circuit. In accordance with the invention, the criteria for such a saturation resistor is that the resistor have a low resistance value at low currents and a high resistance value at high currents.

Figure 4:
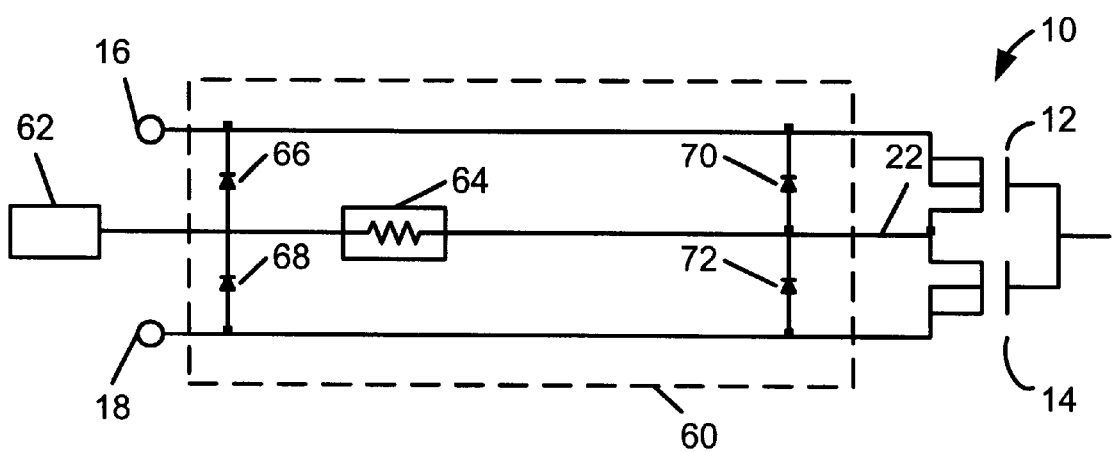
FIGS. 4 and 5 illustrate various embodiments of an ESD protection circuit in accordance with the invention.

FIG. 4 illustrates schematically an electrostatic discharge protection circuit 60 in accordance with an embodiment of the invention. ESD circuit 60 is coupled between the output 22 of a CMOS circuit 10 and an output terminal pad 62. Output terminal 62 provides the means by which the output signal from the CMOS circuit is coupled in its intended operation. That is, output terminal 62 can be coupled to a PC board or other application to receive the output signal from the CMOS circuit. A saturation attenuation resistor 64 is coupled in series between output 22 and output terminal 62. Saturation attenuation resistor 64 has the characteristics described above, that is, a low resistance at low current levels and a high resistance at high current levels. Also included in ESD protection circuit 60, in addition to saturation resistor 64, are one or more impedance devices. The impedance devices provide an ESD current shunt path. In accordance with one embodiment of the invention, the ESD current shunt path is provided by diodes 66, 68, 70, and 72. Each of these diodes can be, for example, a conventional PN junction diode. Diode 66 is coupled between output terminal 62 and a reference potential 16. Diode 68 is coupled between output terminal 62 and a second reference potential 18. Diode 70 is coupled between CMOS circuit output 22 and the first reference potential. Diode 72 is coupled between output 22 and the second reference potential. Diode 70 and 72 can be the drain to substrate diodes associated with transistors 12 and 14, respectively, or can be additional PN junction diodes formed in the semiconductor substrate. Each of the diodes is biased to be reverse biased during normal operation of CMOS circuit 10. The first and second reference potentials can be internally generated by a portion (not illustrated) of the CMOS circuit, or can be externally applied.

During normal operation of CMOS integrated circuit 10, an output signal is conveyed from output 22 to output terminal 62 through saturation resistor 64. Because the normal output signal is a relatively low current signal, saturation resistor 64 has a low value and has little effect on the output drive current. In the event that an ESD transient is coupled to output terminal 62, however, a portion of that signal is shunted by diodes 66 and 68. The remaining portion of that transient passes through saturation resistor 64 and, because the ESD transient is a high current pulse, the saturation resistor takes on a high resistance value. Because the saturation resistor has a high resistance value, a significant portion of the transient pulse is dissipated in resistor 64 as an voltage drop equal to the product of the transient current and the resistance of the saturation resistor. As a result of the high voltage drop in resistor 64, a significantly lower voltage appears at output 22 as compared to the voltage at output terminal 62. The portion of the transient appearing at output 22 is further shunted by diodes 70 and 72 so that the voltage applied to the gate insulators of transistors 12 and 14 is reduced to a value that is not high enough to cause damage to those dielectrics.

Figure 5:
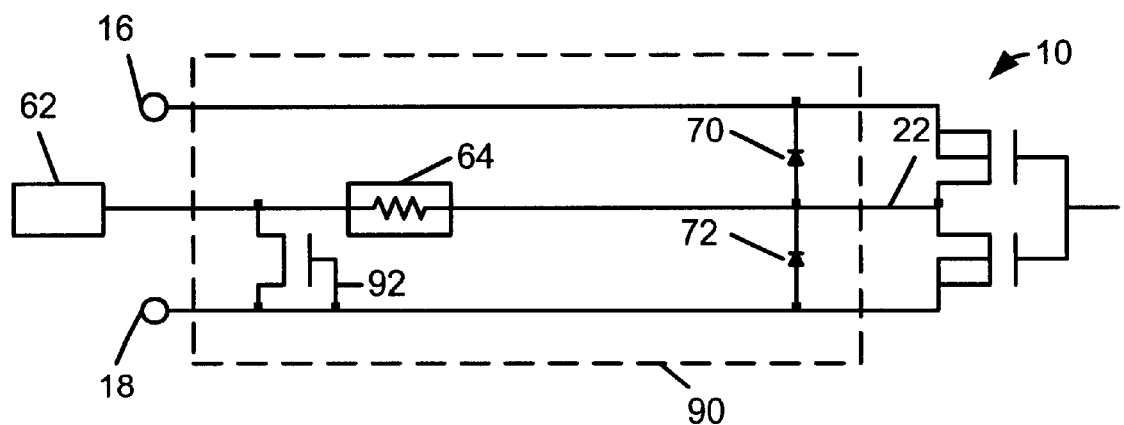

FIG. 5 illustrates schematically a further embodiment of the invention. As illustrated in FIG. 5, an ESD protection circuit 90 is coupled between the output 22 of a CMOS circuit 10 and an output terminal pad 62. ESD protection circuit 90, in accordance with this embodiment of the invention, includes a saturation resistor 64 coupled in series between output 22 and output terminal 62. In addition, an N channel snap-back field effect transistor 92 is coupled between output 62 and a voltage reference 18. N channel MOS transistors are known to "snap-back" if sufficient voltage (a voltage exceeding the "trigger voltage") is applied between source and drain of the transistor. In the snap-back mode the current and voltage characteristics of the transistor are such that the voltage across the transistor, that is, the voltage from source to drain, is reduced from a voltage near the breakdown voltage of the device to a very low holding voltage. Correspondingly, the current is low when the voltage is near the breakdown voltage, but switches to a high current value when the device snaps back to the holding voltage condition. The device thus switches from a high impedance device to a low impedance device when a trigger voltage is applied between the source and drain of the transistor causing the transistor to snap back. Snap-back transistor 92 can be fabricated as a field oxide transistor. That is, transistor 92 is fabricated with a thick field oxide used as the gate dielectric. Transistor 92 can be fabricated having a metal gate electrode, although in some applications no gate electrode is needed.

Again, in the normal operation of CMOS circuit 10 the output of the circuit is a low current and saturation resistor 64 has a low resistance value. Such a low resistance value does not seriously degrade the output drive characteristics of the CMOS circuit. Under those conditions snap back transistor 92 has a high impedance value. If a high energy ESD transient is applied to output terminal 62, saturation resistor 64 assumes a high resistance value and allows the output terminal voltage to exceed the trigger voltage of transistor 92. When the voltage at the output terminal exceeds the trigger voltage, snap back transistor 92 assumes a low impedance condition and is able to shunt a portion of the ESD transient. Together, saturation resistor 64 and snap back transistor 92 serve to reduce the voltage appearing at output 22 to a value sufficiently low as to not damage the gate dielectric of output transistors 12 and 14.

Figure 6:
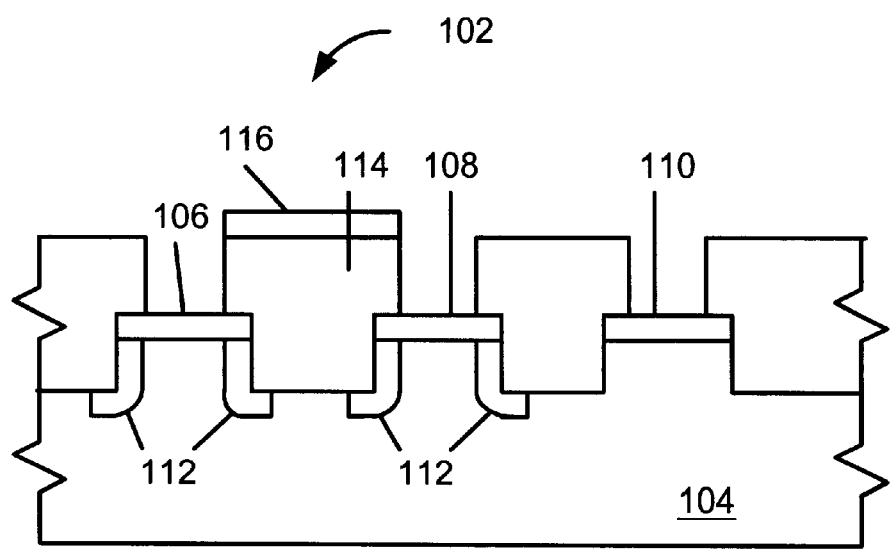
FIG. 6 illustrates schematically, in cross-section, fabrication of a snap-back transistor in accordance with an embodiment of the invention.

FIG. 6 illustrates, in cross-section, one implementation of a snap-back transistor 102 in accordance with the invention. Transistor 102 includes a P type substrate 104 in which N type source and drain regions 106, 108, respectively, are formed. Also formed in substrate 104 is a heavily doped P type contact 110 that facilitates electrical contact to substrate 104. A lightly doped guard band 112 is formed at the edges of the source and drain regions to increase the break down voltage at the isolation edges of the PN junction formed between the drain and substrate and between the source and substrate. The guard band thus blocks breakdown at the junction edges so that the breakdown voltage of the drain-substrate and source-substrate junctions are the breakdown voltages representative of the interior area of the junction. Guard band 112 can be formed by using the same implantation used to form the N type well in which portions of the CMOS circuit are formed. A gate dielectric 114 is formed of thick field oxide, the same field oxide used for isolation between devices. Overlying gate dielectric 114 is a metal gate electrode 116. The gate electrode has little influence on the conduction characteristics of the device because of the thick ,ate dielectric and may be omitted in certain applications. Transistor 102 is preferably formed with a high W/L ratio to allow the device to non-destructively carry high currents in the snap-back mode. Fabricated in this manner, using a standard 0.18 $\mu$m process, the trigger voltage of the snap back transistor is about 12 volts and the N type well to substrate breakdown voltage is about 16 volts. The saturation resistor can thus stand off enough voltage between the output terminal and the output of the CMOS inverter to allow the field snap back transistor to trigger into the low impedance conducting state. Once triggered, the voltage at the output terminal drops to the holding voltage plus the drain-source resistance of the transistor in the "on" state.

Thus it is apparent that there has been provided, in accordance with the invention, an electrostatic discharge protection circuit that fully meets the needs set forth above. Although the various embodiments of the invention have been described and illustrated with respect to specific embodiments thereof, it is not intended that the invention be limited to these illustrative embodiments. Those of skill in the art will recognize that variations and modifications can be made to the illustrative embodiment without departing from the scope of the invention. For example, the CMOS circuit has been illustrated throughout as a simple CMOS inverter, but it is not intended that the invention be limited to protecting such a CMOS circuit. Rather it is intended that the protection circuit in accordance with the invention be applicable as a protection circuit for the output of any MOS circuit. Accordingly, it is intended that the invention encompass all such variations and modifications as fall within the scope of the appended claims.

What is claimed is:

1. A CMOS circuit comprising:
   a circuit function having an output;
   an output terminal; and
   a saturation attenuation resistor coupling the output to the output terminal, wherein the saturation attenuation resistor includes a substrate of a first conductivity type, a well region of a second conductivity type and first and second spaced apart contact areas of the second conductivity type formed in the well region.

2. The CMOS circuit of claim 1 wherein the saturation attenuation resistor comprises a resistor region formed by ion implantation.

3. The CMOS circuit of claim 1 wherein the saturation attenuation resistor further comprises an isolation region formed in the well region between the first and second spaced apart contact areas.

4. An electrostatic discharge protection circuit for protecting the output of an MOS circuit, the protection circuit comprising:
   a first diode coupled between the output and a first reference potential;
   a second diode coupled between the output and a second reference potential;
   a third diode coupled between an output terminal and the first reference potential;
   a fourth diode coupled between the output terminal and the second reference potential; and
   a saturation resistor coupled between the output and the output terminal.

5. An electrostatic discharge protection circuit for protecting an output of a MOS circuit, the protection circuit comprising:
   an output terminal;
   a saturation resistor coupled between the output and the output terminal;
   an impedance device coupled between the output terminal and a reference potential;
   a substrate of a first conductivity type; and
   a well region of a second conductivity type, and wherein the saturation resistor comprises a first and second spaced apart contact areas of the second conductivity type formed in the well region.

6. The electrostatic discharge protection circuit of claim 5 wherein the impedance device comprises a diode.

7. The electrostatic discharge protection circuit of claim 6 wherein the diode comprises a PN junction diode.

8. The electrostatic discharge protection circuit of claim 7 further comprising a second PN junction diode coupled between the output terminal and a second reference potential.

9. The electrostatic discharge protection circuit of claim 5 wherein the impedance device comprises an MOS transistor.

10. The electrostatic discharge protection circuit of claim 9 wherein the MOS transistor comprises a snap-back MOS transistor.

11. The electrostatic discharge protection circuit of claim 10 wherein the snap-back MOS transistor comprises an N channel MOS transistor having a gate dielectric and wherein the gate dielectric comprises field oxide.

12. The electrostatic discharge protection circuit of claim 11 wherein the N channel MOS transistor comprises a metal gate electrode.

13. The electrostatic discharge protection circuit of claim 1 wherein the snap-back MOS transistor comprises;
   a drain region formed in a substrate and forming a drain-substrate diode, and
   a guard band positioned at the edge of the drain region to enhance the reverse breakdown voltage of the drain-substrate diode.

14. The electrostatic discharge protection circuit of claim 5 further comprising:
   an isolation region formed in the well region between the first and second spaced apart contact areas, the isolation region extending into the well region from the surface thereof, but not extending through the entirety of the well region.

* * * * *

UNITED STATES PATENT AND TRADEMARK OFFICE
CERTIFICATE OF CORRECTION

PATENT NO.    : 6,445,601 B1
DATED         : September 3, 2002
INVENTOR(S)   : Worley It is certified that error appears in the above-identified patent and that said Letters Patent is hereby corrected as shown below:

<u>Column 8,</u>
Line 20, delete "1" and replace with -- 11 --.

Signed and Sealed this

Twenty-fourth Day of December, 2002

JAMES E. ROGAN
*Director of the United States Patent and Trademark Office*